(12) United States Patent
Chen et al.

(10) Patent No.: US 11,216,110 B2
(45) Date of Patent: Jan. 4, 2022

(54) TOUCH SUBSTRATE, TOUCH DISPLAY PANEL AND TOUCH DISPLAY DEVICE TO EQUALIZE RESISTANCE IN TOUCH CONTROL LEAD WIRES AND AVOID INTERFERENCE BETWEEN SIGNALS THEREON

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Chuanbao Chen, Beijing (CN); Yuanning Xu, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

(*) Notice: Subject to any disclaimer, the term of this patent is extended or adjusted under 35 U.S.C. 154(b) by 743 days.

(21) Appl. No.: 16/072,911

(22) PCT Filed: Jan. 5, 2018

(86) PCT No.: PCT/CN2018/071505
§ 371 (c)(1),
(2) Date: Jul. 26, 2018

(87) PCT Pub. No.: WO2018/205660
PCT Pub. Date: Nov. 15, 2018

(65) Prior Publication Data
US 2021/0208733 A1    Jul. 8, 2021

(30) Foreign Application Priority Data

May 12, 2017   (CN) .......................... 201710333250.0

(51) Int. Cl.
*G06F 3/041*    (2006.01)
*G06F 3/044*    (2006.01)
(Continued)

(52) U.S. Cl.
CPC ...... *G06F 3/04164* (2019.05); *G02F 1/13338* (2013.01); *G06F 3/0412* (2013.01);
(Continued)

(58) Field of Classification Search
CPC .................................................. G06F 3/04164
See application file for complete search history.

(56) References Cited

U.S. PATENT DOCUMENTS

2015/0062067 A1    3/2015 Hong et al.
2016/0291781 A1*  10/2016 He ........................ G06F 3/0412
2018/0203541 A1    7/2018 Liu et al.

FOREIGN PATENT DOCUMENTS

CN    104699348 A    6/2015
CN    104793803 A    7/2015
(Continued)

OTHER PUBLICATIONS

Search Report and Written Opinion for International Application No. PCT/CN2018/071505 dated Apr. 3, 2018.
(Continued)

*Primary Examiner* — Laurence J Lee
(74) *Attorney, Agent, or Firm* — Calfee, Halter & Griswold LLP (57) ABSTRACT

The present disclosure provides a touch substrate, a touch display panel, and a touch display device. The touch substrate includes: a base substrate, an integrated circuit element disposed on the base substrate and located in a border area, a plurality of touch electrodes arranged in an array on the base substrate and located in a touch area, as well as touch leads configured to electrically connect the integrated
(Continued)

circuit element to each of the touch electrodes. The plurality of touch electrodes are divided into a first group directly adjacent to the integrated circuit element and a second group spaced apart from the integrated circuit element by the first group. Each touch electrode in the second group is electrically connected to the integrated circuit element through two touch leads, respectively, and each touch electrode in the first group is electrically connected to the integrated circuit element through one touch lead.

18 Claims, 4 Drawing Sheets

(51) Int. Cl.
    *G02F 1/1333*      (2006.01)
    *H01L 27/32*      (2006.01)

(52) U.S. Cl.
    CPC .......... *G06F 3/0445* (2019.05); *H01L 27/323* (2013.01); *G06F 2203/04111* (2013.01)

(56) References Cited

FOREIGN PATENT DOCUMENTS

| | | | |
|---|---|---|---|
| CN | 204904248 U | | 12/2015 |
| CN | 105808014 A | | 7/2016 |
| CN | 205563508 U | | 9/2016 |
| CN | 205899516 U | * | 1/2017 |
| CN | 205899516 U | | 1/2017 |
| CN | 107422903 A | | 12/2017 |

OTHER PUBLICATIONS

First Office Action for Chinese Patent Application No. 201710333250.0 dated Jun. 5, 2018.

* cited by examiner

TOUCH SUBSTRATE, TOUCH DISPLAY PANEL AND TOUCH DISPLAY DEVICE TO EQUALIZE RESISTANCE IN TOUCH CONTROL LEAD WIRES AND AVOID INTERFERENCE BETWEEN SIGNALS THEREON

The present application is the U.S. national phase entry of PCT/CN2018/071505 filed on Jan. 5, 2018, which claims the benefit of Chinese Patent Application No. 201710333250.0 filed on May 12, 2017, the entire disclosures of both are incorporated herein by reference.

TECHNICAL FIELD

The present disclosure relates to the field of touch technologies, and particularly to a touch substrate, a touch display panel and a touch display device.

BACKGROUND

With the development of display industry, touch panels of a Full in Cell structure have attracted more and more attention due to their advantages such as higher integration, lightness, thinness, good touch signals, low cost, and so on. In such a touch panel, the distribution of touch leads electrically connected to touch electrodes is an important factor taken into account by designers.

SUMMARY

An objective of the present disclosure is to provide an improved touch substrate, a touch display panel, and a touch display device.

An aspect of the present disclosure provides a touch substrate having a touch area and a border area surrounding the touch area. The touch substrate comprises: a base substrate, an integrated circuit element located on the base substrate and in the border area, a plurality of touch electrodes arranged in an array on the base substrate and in the touch area, as well as touch leads configured to electrically connect the integrated circuit element to each of the touch electrodes. The plurality of touch electrodes are divided into multiple groups in a direction perpendicular to an extending direction of the integrated circuit element, each group including at least one row or at least one column of touch electrodes parallel to the extending direction of the integrated circuit element. Touch leads for electrically connecting each of the touch electrodes in a same group to the integrated circuit element are the same in number, and touch leads for electrically connecting each of the touch electrodes in different groups to the integrated circuit element are different in number. In particular, the number of touch leads for electrically connecting each of the touch electrodes in different groups to the integrated circuit element increase as the distances from said groups to the integrated circuit element increase.

According to some embodiments, an orthographic projection of each touch lead on the base substrate overlaps that of at least one touch electrode between a touch electrode connected by the touch lead and the integrated circuit element on the base substrate.

According to some embodiments, each of the touch electrodes in a group of touch electrodes closest to the integrated circuit element is electrically connected to the integrated circuit element through one touch lead.

According to some embodiments, the touch electrodes are divided into two groups, which are a first group directly adjacent to the integrated circuit element, and a second group spaced apart from the integrated circuit element by the first group. Each of the touch electrodes in the second group is electrically connected to the integrated circuit element through two touch leads respectively. Each of the touch electrodes in the first group is electrically connected to the integrated circuit element through one touch lead respectively.

According to some embodiments, the touch substrate comprises a base substrate, touch leads on the base substrate, an insulating layer on the touch leads, and touch electrodes on the insulating layer. The insulating layer includes a plurality of via holes, and each of the touch electrodes is electrically connected to a touch lead to which the touch electrode corresponds through a via hole.

According to some embodiments, the via holes are in one-to-one correspondence with the touch leads.

According to some embodiments, the touch electrodes are all touch detection electrodes, and the touch detection electrodes are configured to receive a detection signal sent by the integrated circuit element via the touch leads, and feed back a response signal after touch to the integrated circuit element via the touch leads.

According to some embodiments, the touch electrodes include touch driving electrodes and touch sensing electrodes arranged at intervals. The touch leads include touch driving lead wires electrically connected to the touch driving electrodes, and touch sensing lead wires electrically connected to the touch sensing electrodes.

According to some embodiments, the touch leads are made of a transparent conductive material.

Another aspect of the present disclosure provides a touch display panel, comprising any of the touch substrates as described above.

According to some embodiments, the touch display panel further comprises data lines disposed in a same layer as the touch leads.

According to some embodiments, the touch display panel is an organic electroluminescent display panel, and the base substrate is an array substrate.

According to some embodiments, the touch display panel is a liquid crystal display panel, and the base substrate is an array substrate.

According to some embodiments, the touch display panel is a liquid crystal display panel, and the base substrate is a color filter substrate.

A further aspect of the present disclosure provides a touch display device, comprising any of the touch display panels as described above.

DETAILED DESCRIPTION OF EMBODIMENTS

To make the above objective, features and advantages of the present disclosure more comprehensible, the present disclosure will be further explained below with reference to the accompanying drawings and embodiments. However, exemplary embodiments can be implemented in various forms, and it should not be construed that the present disclosure is limited to the embodiments as set forth herein. Rather, these embodiments are provided to make the present disclosure more comprehensive and complete, and communicate the concept of exemplary embodiments to those skilled in the art comprehensively. The same reference numerals in the drawings denote the same or similar structures, and thus the repeated description thereof will be omitted. The words expressing positions and orientations as described in the present disclosure are all explained based on the drawings, but modifications may also be made as needed, and the modifications are all included in the scope of the present disclosure. The drawings of the present disclosure are only used to illustrate the relative positional relationships, and the layer thicknesses of some parts are drawn in an exaggerated manner to facilitate understanding. Thus, the layer thicknesses in the drawings do not represent the proportional relationships of the actual layer thicknesses.

It is to be noted that specific details are set forth in the description below to facilitate full understanding of the present disclosure. However, the present disclosure can be implemented in a variety of other ways than those described herein. Those skilled in the art can make similar extensions without departing from the scope of the present disclosure. The present disclosure is therefore not limited by specific embodiments as disclosed below. Certain terms are used throughout the specification and the claims to refer to particular components. Those skilled in the art can understand that hardware manufacturers may refer to the same component using different language. The present specification and claims do not distinguish components in terms of different names, but take the difference in the functions of components as the distinguishing criterion. The word of "comprise" as mentioned throughout the specification and claims is an open term, and should be interpreted as "including but not limited to". What are described below are exemplary embodiments for implementing the present application, but the description is for the purpose of illustrating the general principle of the present application rather than limiting the scope thereof. The protection scope of the present application shall be based on the scope of the appended claims. It will be understood that when an element such as a layer, a film, a region or a substrate is referred to as being "on" another element, it may be directly on the other element, or one or more intermediate elements may be inserted.

Generally, in a display panel or a touch substrate having a touch function, a touch electrode is divided into a number of touch electrode blocks, and each touch electrode block is electrically connected to an integrated circuit element in the display panel or the touch substrate through a corresponding touch lead.

However, due to the distribution of touch electrode blocks, the lengths of touch leads connected to the integrated circuit element are inconsistent, wherein the line segments of touch leads connected to the touch electrode blocks farther from the integrated circuit element are longer, and the line segments of touch leads connected to the touch electrode blocks closer to the integrated circuit element are shorter. Since the touch leads differ in length, different delays occur in time when the touch signals at the distal end and the proximal end of the display panel or the touch substrate are transmitted to the integrated circuit element, thereby affecting the touch effect.

The present disclosure provides a touch substrate, a touch display panel, and a touch display device, which can avoid different signal delays caused by different lengths of the touch leads for connecting the touch electrodes to the integrated circuit element.

Specific embodiments of the touch substrate, the touch display panel and the touch display device as provided by embodiments of the present disclosure are described in detail below with reference to the accompanying drawings.

The thicknesses and shapes of film layers in the drawings are not drawn true to scale and are merely intended to illustrate the present disclosure.

Figure 1:
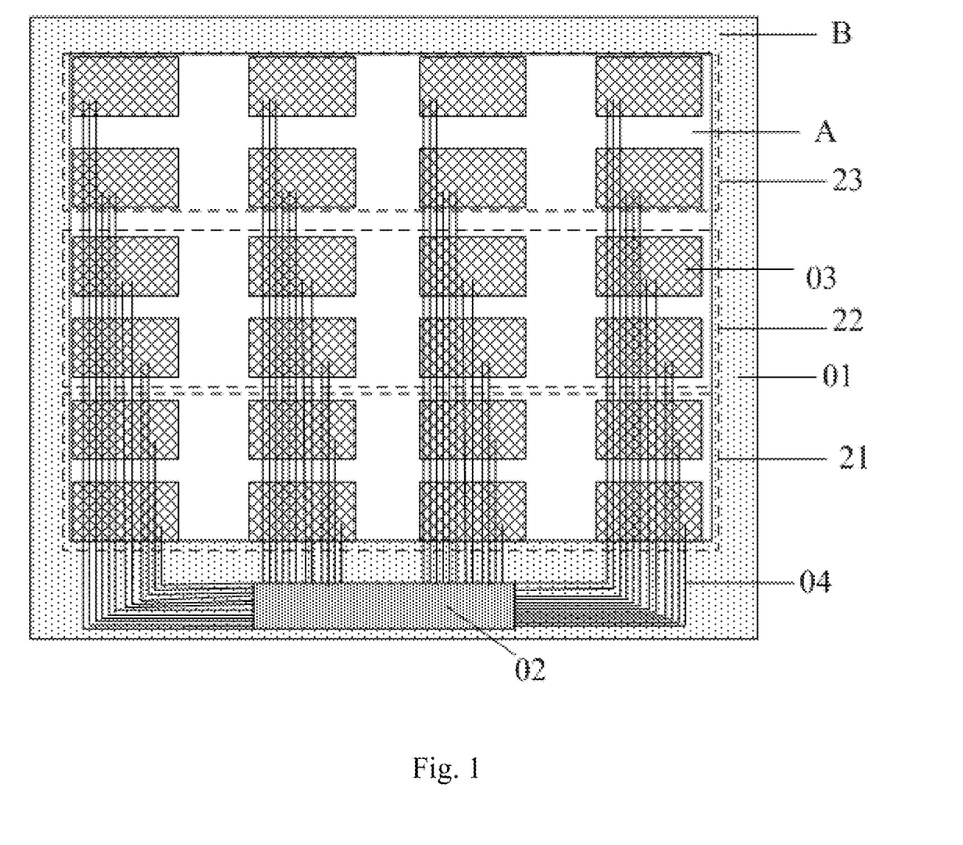
FIG. 1 is a top view of a touch substrate provided by an embodiment of the present disclosure.

Referring to FIG. 1, a touch substrate provided by an embodiment of the present disclosure has a touch area A and a border area B surrounding the touch area A. The touch substrate comprises: a base substrate 01, an integrated circuit element 02 located on the base substrate 01 and in the border area B, a plurality of touch electrodes 03 arranged in an array on the base substrate 01 and in the touch area A, as well as touch leads 04 configured to connect the integrated circuit element 02 to each of the touch electrodes 03.

The plurality of touch electrodes 03 are divided into multiple groups in a direction perpendicular to an extending direction of the integrated circuit element. Each group includes at least one row or at least one column of touch electrodes 03 parallel to the extending direction of the integrated circuit element 02. The touch leads 04 for connecting each of the touch electrodes 03 in the same group to the integrated circuit element 02 are the same in number, and the touch leads 04 for connecting each of the touch electrodes 03 in different groups to the integrated circuit element 02 are different in number.

Specifically, the number of the touch leads 04 for connecting each of the touch electrodes 03 in different groups to the integrated circuit element 02 increase as distances from said groups to the integrated circuit element 02 increase.

Generally, the integrated circuit element has an elongated shape. The extending direction of the integrated circuit element in embodiments of the present disclosure refers to the long-side direction of the integrated circuit element, and the direction perpendicular to the extending direction of the integrated circuit element in embodiments of the present disclosure refers to the extending direction of the short side of the integrated circuit element. When the integrated circuit element is disposed in the upper or lower border of the touch substrate, the touch electrodes are divided into multiple groups in a direction perpendicular to the extending direction of the integrated circuit element, and each group includes at least one row of touch electrodes. When the integrated circuit element is disposed in the left or right border of the touch substrate, the touch electrodes are divided into multiple groups in a direction perpendicular to the extending direction of the integrated circuit element, and each group includes at least one column of touch electrodes.

It is to be noted that, after the touch electrodes are divided into groups, the touch electrodes in different groups may be the same or different in number, and the number of touch electrodes in each group is not specifically limited here, which may be one or more rows (or one or more columns) of touch electrodes. No limitation is imposed here in this regard. The integrated circuit element may be disposed in the upper, lower, left or right border of the touch substrate. For example, referring to FIG. 1, the integrated circuit element 02 is disposed in the lower border of the touch substrate. Correspondingly, the touch electrodes 03 are divided into at least two groups in a direction away from the integrated circuit element 02. However, the touch electrodes 03 are not limited to being divided into three groups, which may also be divided into four or more groups. No limitation is imposed here in this regard.

FIG. 1 only schematically illustrates a case where the touch electrodes 03 are divided into three groups, which are a first group 21, a second group 22, and a third group 23 respectively. Each of the touch electrodes 03 in the first group 21 is electrically connected to the integrated circuit element 02 through one touch lead 04, each of the touch electrodes 03 in the second group 22 is electrically connected to the integrated circuit element 02 through two touch leads 04 respectively, and each of the touch electrodes 03 in the third group 23 is electrically connected to the integrated circuit element 02 through three touch leads 04 respectively. It is to be noted that the present disclosure is not limited to the grouping and the touch lead connections as shown in FIG. 1. In a specific embodiment, the touch electrodes in each group may include only one row or multiple rows.

FIG. 1 only shows a rectangular touch electrode as an example, but the present disclosure is not limited to a rectangular touch electrode, and may further include other shapes such as a diamond shape, which is not specifically limited herein.

In embodiments of the present disclosure, the farther the touch electrodes are spaced from the integrated circuit element, the larger the number of touch leads that are connected to the integrated circuit element will be. The closer the touch electrodes are to the integrated circuit element, the smaller the number of touch leads that are connected to the integrated circuit element will be. For example, in FIG. 1, each of the touch electrodes 03 in the group 21 of touch electrodes closest to the integrated circuit element 02 is electrically connected to the integrated circuit element 02 through one touch lead 04, and each of the touch electrodes 03 in the group 23 of touch electrodes farthest from the integrated circuit element 02 is electrically connected to the integrated circuit element 02 through three touch leads 04 respectively. FIG. 1 is only one embodiment. In other embodiments, each of the touch electrodes in the group of touch electrodes closest to the integrated circuit element may be electrically connected to the integrated circuit element through two touch leads respectively.

In the touch substrate provided by the present disclosure, the touch electrodes are divided into multiple groups in a direction perpendicular to the extending direction of the integrated circuit element, and each group includes at least one row or column of touch electrodes parallel to the extending direction of the integrated circuit element. Touch leads for connecting each touch electrode in the same group to the integrated circuit element are the same in number, touch leads for connecting each touch electrode in different groups to the integrated circuit element are different in number, and the numbers of touch leads for connecting each touch electrode in different groups to the integrated circuit element increase as the distances from said groups to the integrated circuit element increase. Therefore, in the touch substrate provided by embodiments of the present disclosure, the number of touch leads for connecting a touch electrode and the integrated circuit element varies with the distance from the touch electrode to the integrated circuit element. By providing each touch electrode with a different number of touch leads connected in parallel, signals transmitted between each touch electrode and the integrated circuit element will undergo substantially the same delay, thereby avoiding different signal delays resulting from different lengths of touch leads.

In the above touch substrate provided by embodiments of the present disclosure, referring to FIG. 1, each of the touch electrodes 03 in the group 21 of touch electrodes closest to the integrated circuit element 02 is electrically connected to the integrated circuit element 02 through one touch lead 04. In other words, each of the touch electrodes in the group of touch electrodes closest to the integrated circuit element may be electrically connected to the integrated circuit element through only one touch lead, and for the groups of touch electrodes farther from the integrated circuit element, the number of touch leads for connecting each touch electrode to the integrated circuit element increase sequentially.

In embodiments of the present disclosure, in case the touch lead is long, the signal delay, when connected to the integrated circuit element, can be reduced by increasing the number of touch leads.

In an exemplary embodiment of the present disclosure, referring to FIG. 1, the orthographic projection of each touch lead 04 on the base substrate 01 overlaps that of at least one touch electrode 03 between a touch electrode 03 connected by the touch lead 04 and the integrated circuit element 02 on the base substrate 01.

For example, referring to FIG. 1, the touch electrodes include 6 rows and 4 columns, which are sequentially divided into a first row, a second row, a third row, a fourth row, a fifth row, and a sixth row from top to bottom. The touch electrodes 03 in the first row and the second row are connected to the integrated circuit element 02 through three touch leads 04 respectively, and the orthographic projection of the touch lead 04 connected to the touch electrode 03 in the first row on the base substrate 01 overlaps the orthographic projections of the touch electrodes 03 in the second row, the third row, the fourth row, the fifth row and the sixth row on the base substrate 01, respectively. Similarly, the orthographic projection of the touch lead 04 connected to the touch electrode 03 in the second row on the base substrate 01 overlaps the orthographic projections of the touch electrodes 03 in the third row, the fourth row, the fifth row and the sixth row on the base substrate 01, respectively.

It is to be noted that, the orthographic projection of each touch lead on the base substrate may overlap the orthographic projection of one touch electrode between a touch electrode connected by the touch lead and the integrated circuit element on the base substrate and may also overlap the orthographic projections of a plurality of touch electrodes on the base substrate. The touch leads in embodiments of the present disclosure may be disposed in the touch area of the touch substrate and overlap the orthographic projections of the touch electrodes on the base substrate, thereby preventing the increased touch leads from affecting the narrow-border design of the touch substrate. The material of the touch lead may be the same as that of the touch electrode, for example, a transparent conductive layer, or the material of the touch lead may be a metal material, which is not specifically limited herein.

Figure 2:
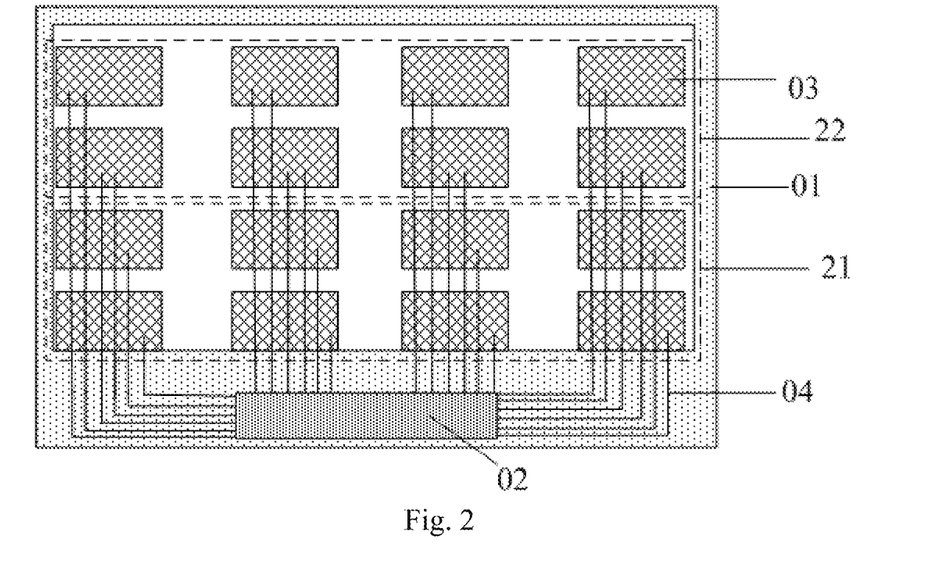
FIG. 2 is a top view of another touch substrate provided by an embodiment of the present disclosure.

In a touch substrate provided by another embodiment of the present disclosure, referring to FIG. 2, the touch electrodes 03 are divided into two groups, which are a first group 21 directly adjacent to the integrated circuit element 02, and a second group 22 spaced apart from the integrated circuit element 02 by the first group 21. Each of the touch electrodes 03 in the second group 22 is connected to the integrated circuit element 02 through two touch leads 04, respectively. Each of the touch electrodes 03 in the first group 21 is connected to the integrated circuit element 02 through one touch lead 04. Specifically, in order to avoid a large number of touch leads in the touch substrate, which further causes interference between signals, the touch electrodes may be divided into two groups, wherein the group of touch electrodes closer to the integrated circuit element are electrically connected to the integrated circuit element through one touch lead, and the group of touch electrodes farther from the integrated circuit element are electrically connected to the integrated circuit element through two touch leads, respectively.

It is to be noted that, the touch electrodes are divided into two groups in a direction perpendicular to the extending direction of the integrated circuit element, wherein the number of touch electrodes in each group is not specifically limited, and the numbers of touch electrodes in the two groups may be the same or different.

Figure 3:
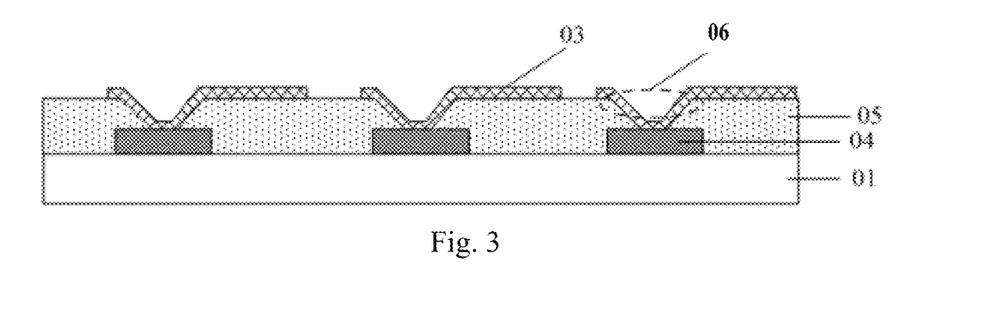
FIG. 3 is a sectional view of a touch substrate provided by an embodiment of the present disclosure.

In the touch substrate provided by embodiments of the present disclosure, referring to FIG. 3, the touch substrate comprises: a base substrate 01, touch leads 04 on the base substrate 01, an insulating layer 05 on the touch leads 04, and touch electrodes 03 on the insulating layer 05. The insulating layer 05 includes a plurality of via holes 06, and each touch electrode 03 is electrically connected to the touch lead 04 corresponding to the touch electrode 03 through a via hole 06.

In the sectional view of the touch substrate as shown in FIG. 3, the touch electrode 03 is electrically connected to the touch lead 04 through the via hole 06 disposed in the insulating layer 05, and two adjacent touch leads 04 are insulated from each other by the insulating layer 05.

Figure 4:
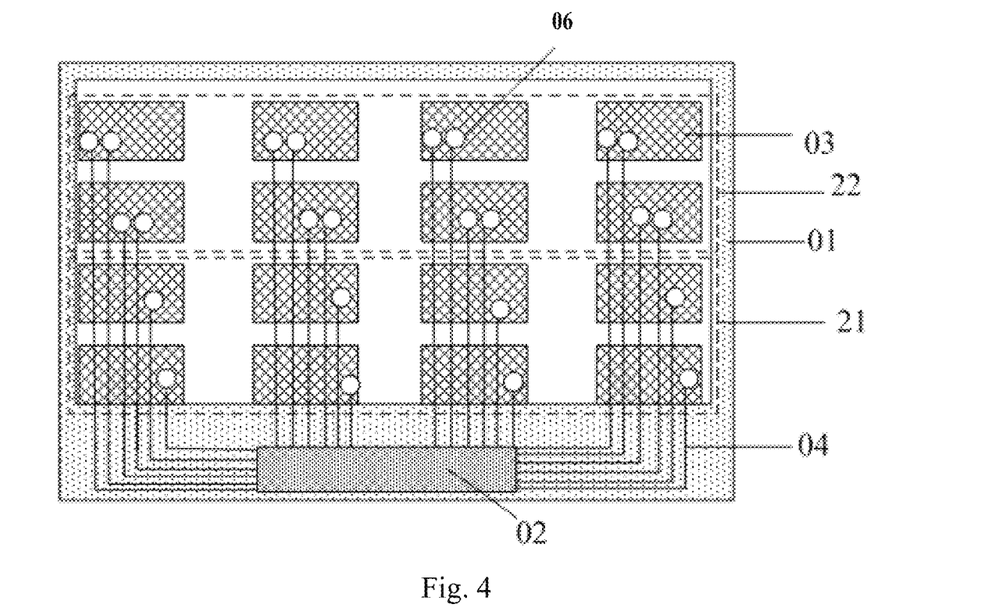
FIG. 4 is a top view of yet another touch substrate provided by an embodiment of the present disclosure.

In the touch substrate provided by embodiments of the present disclosure, referring to FIG. 4, for each touch electrode 03, the number of via holes 06 is the same as that of touch leads 04. Specifically, each of the touch electrodes 03 in the first group 21 is electrically connected to the integrated circuit element 02 through one touch lead 04 and one via hole 06 disposed in the insulating layer. Each of the touch electrodes 03 in the second group 22 is electrically connected to the integrated circuit element 02 through two touch leads 04 and two via holes 06 disposed in the insulating layer. As shown in FIG. 4, the touch leads 04 are in one-to-one correspondence with the via holes 06.

In a specific embodiment, in the above touch substrate provided by embodiments of the present disclosure, all the touch electrodes may be touch detection electrodes, which receive a detection signal sent by the integrated circuit element through the touch leads, and feed back a response signal after touch to the integrated circuit element through the touch leads.

It is to be noted that the touch electrodes in embodiments of the present disclosure may be touch detection electrodes disposed in the same layer or in different layers, and each of the touch detection electrodes is electrically connected to the integrated circuit element through the touch leads and via holes.

Figure 5:
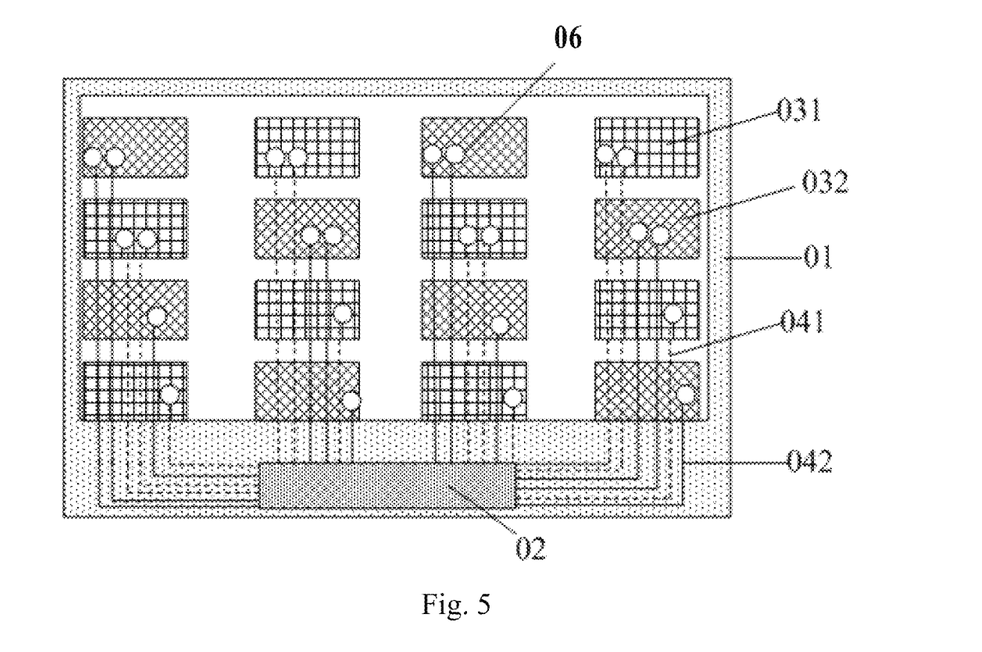
FIG. 5 is a top view of a touch substrate provided by an embodiment of the present disclosure.

In another touch substrate provided by embodiments of the present disclosure, referring to FIG. 5, the touch electrodes include touch driving electrodes 031 and touch sensing electrodes 032 arranged at intervals. Correspondingly, the touch leads include touch driving lead wires 041 connected to the touch driving electrodes 031 and touch sensing lead wires 042 connected to the touch sensing electrodes 032.

It is to be noted that the touch electrodes in embodiments of the present disclosure may be touch driving electrodes or touch sensing electrodes disposed in the same layer. Alternatively, the touch electrodes may be touch driving electrodes and touch sensing electrodes that are disposed in the same layer and insulated from each other, which is not limited herein. FIG. 5 illustrates the present disclosure only by taking the touch driving electrodes and the touch sensing electrodes disposed in the same layer as an example, but the present disclosure is not limited to the structure as shown in FIG. 5.

In a specific embodiment, in the above touch substrate provided by embodiments of the present disclosure, the touch lead may be made of a transparent conductive material or may be made of a non-transparent conductive material. Further, in order to prevent the wiring of touch leads from affecting the display effect of touch substrate, the touch lead may be made of the same material as the touch electrode.

Embodiments of the present disclosure further provide a touch display panel, comprising any of the above touch substrates as provided by embodiments of the present disclosure. For embodiments of the touch display panel, reference can be made to the embodiments of the touch substrate as described above, and the repeated description is omitted.

In the touch display panel provided by embodiments of the present disclosure, the touch display panel may be a touch display panel of an in-cell structure or a touch display panel of an on-cell structure.

According to an exemplary embodiment, the touch display panel having an in-cell structure may be a liquid crystal display panel, or an organic electroluminescent display panel. In the case of a liquid crystal display panel, the touch display panel comprises an array substrate and a color filter substrate disposed for assembly. Specifically, the base substrate of the touch substrate in embodiments of the present disclosure may be an array substrate or a color filter substrate. For an organic electroluminescent display panel, the touch display panel comprises an array substrate and a cover plate, and the base substrate of the touch substrate in embodiments of the present disclosure is an array substrate.

Figure 6:
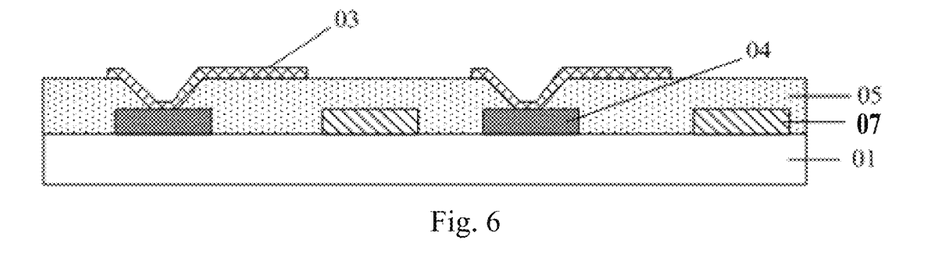
FIG. 6 is a sectional view of a touch display panel provided by an embodiment of the present disclosure.

In a touch display panel provided by an embodiment of the present disclosure, referring to FIG. 6, the touch display panel further comprises data lines 07 disposed in the same layer as the touch leads 04. Typically, a touch display panel comprises a pixel electrode and data lines for providing data signals to the pixel units. The data lines 07 and the touch leads 04 may be disposed in the same layer or in different layers. In particular, the data lines are insulated from the touch leads.

In the touch display panel provided by embodiments of the present disclosure, the number of touch leads for connecting a touch electrode and the integrated circuit element varies with the distance from the touch electrode to the integrated circuit element. By providing each touch electrode with a different number of touch leads connected in parallel, signals transmitted between each touch electrode and the integrated circuit element will undergo substantially the same delay, thereby avoiding different signal delays resulting from different lengths of the touch leads.

It is to be noted that, for other signal leads in the touch display panel, if different signal delays are caused by different lengths of the signal leads, the concept of embodiments of the present disclosure may be used to improve the signal leads, thereby avoiding different signal delays resulting from different lengths of the signal leads, and thus improving the display effect.

Embodiments of the present disclosure further provide a touch display device, comprising any of the touch display panels as provided by embodiments of the present disclosure.

The touch display device may be any product or component having a display function and a touch function, such as a mobile phone, a tablet computer, a notebook computer, a digital photo frame, a navigator, and the like. For embodiments of the touch display device, reference may be made to the embodiments of the touch display panel as described above, and the repeated description is omitted.

In the touch display device provided by the present disclosure, the touch electrodes are divided into multiple groups in a direction perpendicular to the extending direction of the integrated circuit element, and each group includes at least one row or column of touch electrodes parallel to the extending direction of the integrated circuit element. Touch leads for electrically connecting each of the touch electrodes in the same group to the integrated circuit element are the same in number, touch leads for electrically connecting each of the touch electrodes in different groups to the integrated circuit element are different in number, and the number of touch leads for connecting each touch electrode in different groups to the integrated circuit element increase as the distances from said groups to the integrated circuit element increase. Therefore, in the touch substrate provided by embodiments of the present disclosure, the number of touch leads for connecting a touch electrode and the integrated circuit element varies with the distance from the touch electrode to the integrated circuit element. By providing each touch electrode with a different number of touch leads connected in parallel, signals transmitted between each touch electrode and the integrated circuit element will undergo substantially the same delay, thereby avoiding different signal delays resulting from different lengths of the touch leads.

It will be apparent to those skilled in the art that various modifications and variations can be made in the present disclosure without departing from the spirit and scope thereof. Thus, if these modifications and variations of the present disclosure fall within the scope of the claims of the present disclosure and their equivalent technologies, the present disclosure is also intended to include these modifications and variations.

The invention claimed is:

1. A touch substrate having a touch area and a border area surrounding the touch area, the touch substrate comprising: a base substrate, an integrated circuit element located on the base substrate and in the border area, a plurality of touch electrodes arranged in an array on the base substrate and in the touch area, and touch leads configured to electrically connect the integrated circuit element to each of the touch electrodes, wherein the plurality of touch electrodes are divided into only two groups in a direction perpendicular to an extending direction of the integrated circuit element, which are a first group directly adjacent to the integrated circuit element and a second group spaced apart from the integrated circuit element by the first group each group including at least one row or at least one column of touch electrodes parallel to the extending direction of the integrated circuit element, and touch leads for electrically connecting each of the touch electrodes in a same group to the integrated circuit element are the same in number, while touch leads for electrically connecting each of the touch electrodes in different groups to the integrated circuit element are different in number, and the touch leads for electrically connecting each of the touch electrodes in different groups to the integrated circuit element increase in number as distance from said groups to the integrated circuit element increase, each of the touch electrodes in the second group is electrically connected to the integrated circuit element through two touch leads, respectively; and each of the touch electrodes in the first group is electrically connected to the integrated circuit element through one touch lead.

2. The touch substrate according to claim 1, wherein an orthographic projection of each touch lead on the base substrate overlaps that of at least one touch electrode between a touch electrode connected by the touch lead and the integrated circuit element on the base substrate.

3. The touch substrate according to claim 1, wherein each of the touch electrodes in a group of touch electrodes closest to the integrated circuit element is electrically connected to the integrated circuit element through one touch lead.

4. The touch substrate according to claim 1, wherein the touch substrate comprises a base substrate, touch leads on the base substrate, an insulating layer on the touch leads, and touch electrodes on the insulating layer, wherein the insulating layer includes a plurality of via holes, and each of the touch electrodes is electrically connected to a touch lead to which the touch electrode corresponds through a via hole.

5. The touch substrate according to claim 4, wherein the via holes are in one-to-one correspondence with the touch leads.

6. The touch substrate according to claim 1, wherein the touch electrodes are all touch detection electrodes, and the touch detection electrodes are configured to receive a detection signal sent by the integrated circuit element via the touch leads, and feed back a response signal after touch to the integrated circuit element via the touch leads.

7. The touch substrate according to claim 1, wherein the touch electrodes include touch driving electrodes and touch sensing electrodes arranged at intervals, and the touch leads include touch driving lead wires electrically connected to the touch driving electrodes, and touch sensing lead wires electrically connected to the touch sensing electrodes.

8. The touch substrate according to claim 1, wherein the touch leads are made of a transparent conductive material.

9. A touch display panel, comprising the touch substrate according to claim 1.

10. The touch display panel according to claim 9, further comprising data lines disposed in a same layer as the touch leads.

11. The touch display panel according to claim 9, wherein the touch display panel is an organic electroluminescent display panel and the base substrate is an array substrate.

12. The touch display panel according to claim 9, wherein the touch display panel is a liquid crystal display panel and the base substrate is an array substrate.

13. The touch display panel according to claim 9, wherein the touch display panel is a liquid crystal display panel and the base substrate is a color filter substrate.

14. A touch display device, comprising the touch display panel according to claim 9.

15. The touch display panel according to claim 9, wherein an orthographic projection of each touch lead on the base substrate overlaps that of at least one touch electrode between a touch electrode connected by the touch lead and the integrated circuit element on the base substrate.

16. The touch display panel according to claim 9, wherein each of the touch electrodes in a group of touch electrodes closest to the integrated circuit element is electrically connected to the integrated circuit element through one touch lead.

17. The touch display panel according to claim 9, wherein the touch substrate comprises a base substrate, touch leads on the base substrate, an insulating layer on the touch leads, and touch electrodes on the insulating layer, wherein the insulating layer includes a plurality of via holes, and
each of the touch electrodes is electrically connected to a touch lead to which the touch electrode corresponds through a via hole.

18. The touch display panel according to claim 17, wherein the via holes are in one-to-one correspondence with the touch leads.

* * * * *